(12) United States Patent
Baucke et al.

(10) Patent No.: US 10,648,937 B2
(45) Date of Patent: May 12, 2020

(54) NONDESTRUCTIVE INSPECTION METHOD FOR COATINGS AND CERAMIC MATRIX COMPOSITES

(71) Applicant: GENERAL ELECTRIC COMPANY, Schenectady, NY (US)

(72) Inventors: Russell Craig Baucke, Cincinnati, OH (US); Glen David Hilderbrand, Cincinnati, OH (US); Timothy Francis Decker, Cincinnati, OH (US); Benjamin Reid Crowgey, Cincinnati, OH (US)

(73) Assignee: General Electric Company, Schenectady, NY (US)

( * ) Notice: Subject to any disclaimer, the term of this patent is extended or adjusted under 35 U.S.C. 154(b) by 329 days.

(21) Appl. No.: 15/335,822

(22) Filed: Oct. 27, 2016

(65) Prior Publication Data

US 2018/0120246 A1    May 3, 2018

(51) Int. Cl.
*G01R 27/28* (2006.01)
*G01N 27/02* (2006.01)
(Continued)

(52) U.S. Cl.
CPC .......... *G01N 27/02* (2013.01); *G01N 21/3563* (2013.01); *G01N 21/3581* (2013.01);
(Continued)

(58) Field of Classification Search
CPC ........ G01R 27/26; G01R 27/00; G01R 15/12; G01R 15/144; G01R 19/00; G01R 19/30;
(Continued)

(56) References Cited

U.S. PATENT DOCUMENTS

2003/0173977 A1\* 9/2003 Little, Jr. .............. G01N 22/00
324/637
2005/0098728 A1 5/2005 Alfano et al.
(Continued)

OTHER PUBLICATIONS

International Search Report and Written Opinion issued in connection with corresponding PCT Application No. PCT/US2017/058879 dated Feb. 14, 2018.

*Primary Examiner* — Raul J Rios Russo
(74) *Attorney, Agent, or Firm* — General Electric; Pamela Kachur (57) ABSTRACT

A method for nondestructive inspection of ceramic structures present as either a ceramic matrix composite structure or a ceramic based coating. Such non-metallic structures are used to provide thermal protection or weight reduction or both to aircraft and their components. The nonmetallic structure is scanned with an electromagnetic pulse in the range of 200 GHz to 4 THz. The electromagnetic pulse includes a plurality of frequencies within the Terahertz range and is not restricted to a single designated frequency. The frequency range is sensitive to changes in impedances and refractive index within the structure. After the electromagnetic pulse passes through the nonmetallic structure, it may be evaluated for changes in impedance in the nonmetallic structure at different locations, and, when present, whether the changes in impedance impact the ability of the structure to perform the function for which it was designed.

16 Claims, 6 Drawing Sheets

(51) Int. Cl.
*G01N 22/02* (2006.01)
*G01N 21/3581* (2014.01)
*G01N 21/3563* (2014.01)
*G01N 21/84* (2006.01)
*G01R 27/26* (2006.01)
*G01R 27/20* (2006.01)
*G01R 15/14* (2006.01)
*G01R 15/12* (2006.01)
*G01R 19/00* (2006.01)
*G01R 19/30* (2006.01)
*G01R 21/06* (2006.01)
*G01N 21/95* (2006.01)
*G01N 27/416* (2006.01)
*G01R 31/26* (2020.01)

(52) U.S. Cl.
CPC ......... *G01N 21/8422* (2013.01); *G01N 21/95* (2013.01); *G01N 22/02* (2013.01); *G01R 15/12* (2013.01); *G01R 15/144* (2013.01); *G01R 19/00* (2013.01); *G01R 19/30* (2013.01); *G01R 21/06* (2013.01); *G01R 27/20* (2013.01); *G01R 27/26* (2013.01); *G01N 27/4162* (2013.01); *G01N 2201/0696* (2013.01); *G01N 2201/105* (2013.01); *G01R 31/2623* (2013.01)

(58) Field of Classification Search
CPC .. G01R 21/06; G01R 31/261; G01R 31/2623; G01N 27/4162
USPC .................. 324/76.11–76.83, 459, 600, 649
See application file for complete search history.

(56) References Cited

U.S. PATENT DOCUMENTS

| | | | |
|---|---|---|---|
| 2007/0090294 A1* | 4/2007 | Safai | G01N 21/3581 250/341.8 |
| 2007/0158571 A1* | 7/2007 | Cole | G01N 21/3581 250/341.8 |
| 2008/0180111 A1* | 7/2008 | Federici | G01N 21/3581 324/639 |
| 2009/0296197 A1* | 12/2009 | Holzwarth | G01J 1/58 359/328 |
| 2011/0168891 A1* | 7/2011 | van der Weide | G01J 3/02 250/334 |
| 2012/0037804 A1* | 2/2012 | Federici | G01N 21/3586 250/341.1 |
| 2012/0050537 A1 | 3/2012 | Ringermacher et al. | |
| 2015/0000405 A1 | 1/2015 | Singh et al. | |
| 2016/0003734 A1* | 1/2016 | Mann | G01N 17/006 250/339.05 |
| 2016/0077027 A1 | 3/2016 | Sweers et al. | |
| 2016/0305869 A1 | 10/2016 | Mann et al. | |
| 2018/0156728 A1* | 6/2018 | Pourkazemi | G01N 21/3581 |

\* cited by examiner

NONDESTRUCTIVE INSPECTION METHOD FOR COATINGS AND CERAMIC MATRIX COMPOSITES

FIELD OF THE INVENTION

The present invention is directed to nondestructive inspection methods and specifically to nondestructive inspection methods for coating systems and ceramic matrix composite materials.

BACKGROUND OF THE INVENTION

Various inspection methods are available to detect indications in materials. These indications are anomalies in materials and may be classified as defects if the anomalies are serious enough to be categorized as a problem during the life of the component of which the material is comprised. When the indications are not serious, they may be classified as acceptable anomalies as their size and shape have been evaluated and deemed not to affect the operation of the component over its useful life.

There are various inspection techniques available. Some of these include visual inspection, eddy current inspection, liquid penetrant inspection, magnetic particle inspection, ultrasonic inspection and radiographic inspection. Each of these techniques has its benefits and limitations and frequently more than one of these inspection techniques are used together to detect and evaluate anomalies in a component.

The oldest of these inspection techniques is visual inspection. Clearly, visual inspection is utilized to evaluate the exposed surface of a component and will disclose indications that are visible from the exterior of the object. The limitations of visual inspection are that it cannot disclose indications that are below the surface of the exterior of the object under inspection and hidden from sight. Visual inspection also may not be able to resolve very small indications that may be open to the exterior surface of the object.

Liquid penetrant inspection utilizes a highly visible fluid liquid applied to the surface of the object. This highly visible liquid is drawn into any surface opening by capillary action. The surface is wiped clean and a powder material having a color that contrasts with that of the liquid is applied to the surface of the object, the powder drawing the highly visible liquid from the openings into which it has penetrated, again by capillary action, onto the surface. The amount of liquid penetrant drawn back to the surface is an indicator of the size or volume of the indication. The limitations of the liquid penetrant inspection are that the indications must be open to the surface and the indications must be fairly small with tight openings to the surface, as a shallow, large indication will have penetrant removed when the surface is wiped clean. Of course, shallow, large indications are usually detected by the visual inspection, which complements liquid penetrant inspection.

Eddy current inspection applies an electric current across the surface of an object. The advantage of the eddy current inspection is that it can detect subsurface indications that are not open to the surface. The limitation of the eddy current technique is that it can only detect indications near the surface of the object under inspection (referred to as near surface indications), as the eddy current is a surface current that does not otherwise penetrate into the object.

Magnetic particle inspection utilizes fine magnetic particles suspended in a highly visible carrier solution. Magnetic particle inspection is limited to ferrous articles. The solution holding the suspended particles is applied to the surface of the article to be inspected and the carrier solution and the magnetic particles are drawn into any opening in the surface by capillary action, similar to liquid penetrant inspection. Excess solution is removed from the surface of the article and an electric current is applied to the surface of the article usually in at least two directions, preferably perpendicular to one another. The electric current results in a magnetic field being formed across any surface openings (and in some cases near surface openings), which draws some particles and visible solutions to the surface. Usually, the solution is a fluorescent solution and the inspection utilizes an ultraviolet or black light to irradiate the surface, making it significantly easier to see the fluorescent solution. The limitations of the magnetic particle penetrant inspection are that the article that is to be inspected must be magnetizable, typically ferrous, indications must be open to the surface and the indications must be fairly small, as a shallow, large indication will have penetrant removed when excess penetrant is removed from the surface. Of course, shallow, large indications are usually detected by the visual inspection. In addition, when contact electrodes are used by the technician to apply the current to the surface of the article, it is possible that arc strikes may occur to the article surface if care is not exercised by the technician. These arc strikes may in certain applications be deemed as damage.

Radiographic inspection utilizes x-rays for detecting anomalous indications in articles based on density differences between the indications and the base materials. This inspection technique is generally very useful when the indications are not otherwise detectable and the density difference between the base material and the indication is great. For example, radiographic inspection is useful to detect cracks or porosity in an article or a tungsten inclusion in a weld. This inspection technique utilizes high energy, short wavelength electromagnetic radiation that passes through different materials at different rates. More of the high energy waves are absorbed dense materials, so materials such as tungsten do not allow the same quantity of waves through as for example, porosity or cracks, which transmit all of the waves. A detector measures the waves transmitted and can pinpoint the density differences. Limitations are that radiographic inspection is not very useful for detecting imperfections in multi-phase materials such as precipitation hardened materials. The precipitates usually are of a different density than the base material, and the relatively uniform distribution of particles make it very difficult to discern an indication in the base material and distinguish it from precipitates. In addition, flat or plate-like indications, when oriented perpendicular to the direction of the incident x-rays also can be difficult to detect, particularly when the thickness of the indication when compared to the overall thickness of the material being inspected is small. However, when the material can be inspected from multiple directions, such indications are readily detectable since a plate-like indication, while having little thickness when approached from one direction, usually has ample thickness when approached from a second direction at a high angle, preferably in the range of 45-90° from the first direction. The detected indications can be compared to established standards to determine their acceptability or their need to be removed.

Ultrasonic inspection utilizes ultrasonic waves which are transmitted through a metallic article to detect indications. Ultrasonic inspection utilizes timed pulses of wavelengths generated in the frequency range of 20 KHz to 20 MHz and transmitted through the bulk of the material under inspection. When the pulse echo technique is utilized, a wave is transmitted from a transducer, reflected from a back surface of the article and returned to the transducer. The amount of time required for the wave to travel through the article is known. A wave returning to the transducer in a shorter period of time is indicative of an indication. Usually, the amount of energy reflected back to the transducer provides the operator with an idea of the size of the indication. When the article can be inspected from a plurality of directions, it may be possible to map the size, shape and location of detected indications. The determination as to the acceptability of an indication may be made on the amount of reflected energy from the indication as well as the size, shape and location of the indications. Ultrasonic inspection is utilized with surface inspection techniques such as liquid penetrant or magnetic particle inspection since ultrasonic inspection is limited in its ability to resolve surface indications due to the large front pulse reflection and back surface reflections. These reflections are usually so large that they mask any reflections from indications that may be present at or near these surfaces. In addition, the frequency of the ultrasonic waves limits the size of the indication that can be resolved. One of the limitations of ultrasonic inspection is that it may not be able to resolve small indications in the path of the applied wave simply because a small indication may not reflect sufficient energy, or the amount of reflective energy may not be a true representation of the size of the indication. Another limitation of ultrasonic inspection is that it cannot be utilized to inspect precipitation hardened materials, simply because precipitates reflect ultrasonic energy making it impossible to discern any anomalous indications and distinguish them from the precipitates. If inspection is to be performed on such materials, it must be accomplished before the precipitates are developed. Similarly, materials including multiple phases, such as particles suspended in a metallic matrix also cannot be inspected due to the reflected energy. The ultrasonic techniques have also required a liquid couplant between the transducer/transceiver and the article, because air is a poor transmitter of ultrasonic energy. However, recent advances in transducer technology have solved this problem, at least for certain wavelengths.

In modern military aircraft, components are fabricated from ceramic matrix composite (CMC) materials in order to lighten the weight of the aircraft. These CMC materials form CMC structures that may replace heavier metallic materials in the same application. While inspection techniques, such as the ones described above are available for use to test the adequacy of metal structures, aside from visual inspection, the same techniques are not available to detect anomalies in CMC structures used in aircraft structures. What is needed is an inspection technique that can detect anomalies in ceramic matrix composite structures, such as lack of bonding, voids, and impedance differences, which may indicate a structural imperfection, so that the structural imperfection may be further evaluated to determine its acceptability or the need for repair.

BRIEF DESCRIPTION OF THE INVENTION

A method for nondestructive inspection of CMC materials and structures is provided. The method comprises scanning a non-metallic CMC structure with an electromagnetic pulse from a pulse generator producing an electromagnetic pulse in the Terahertz range. The pulse is sequentially applied to the CMC structure during the scan. The scan comprises the application of the pulse for a first predetermined period of time to a first location, followed by a second period of time in which no pulse is generated. The pulse generator is indexed to a second position and the pulse is applied in the same manner at the second position. This process is repeated until the CMC structure is completely scanned. The nondestructive method of inspection is useful for inspecting a CMC structure that typically is used as a light weight component in an aircraft.

The CMC structure is scanned with an electromagnetic pulse in the Terahertz range, that is, an electromagnetic pulse in the range of 200 GHz to 4 THz. The electromagnetic pulse includes a plurality of frequencies within the Terahertz range and is not restricted to a single designated frequency. After the electromagnetic pulse passes through the CMC structure, it is sent to a signal analyzer, analyzed and evaluated. The evaluation further comprises determining whether there are differences in the impedance of the CMC structure at different locations. When a determination that there are differences in the index of refraction or impedance of the CMC structure, the differences are assessed to further determine whether the differences impact the ability of the CMC structure to survive when used in its intended application.

One of the advantages of the present invention is that it provides a method for nondestructively inspecting a CMC structure. Because the test method relies on a determination of differences in indices of refraction, the test method may be useful for inspecting a non-metallic structure that includes a second phase. The second phase may be metallic or non-metallic. This inspection technique may be used in conjunction with other inspection techniques when other inspection techniques are viable. Furthermore, this inspection technique is an available, reliable tool for assessing the integrity of a CMC structure, even a CMC structure or a ceramic structure that includes a second phase, when other inspection techniques are limited or ineffective.

Another advantage of the present invention is that the results of the scan in the form of the signal sent to the signal analyzer may be stored for future evaluation.

Still another advantage of the present invention s that when performed properly, the scan can determine the location of anomalies in three dimensions.

Yet another advantage of the present invention is that the scan, since it uses a pulse that encompasses a broad range of frequencies, can resolve anomalies to about 1 mil (0.001 inches). The pulse may also be filtered so that the scan evaluation may be performed across a narrower band of frequencies, although resolution to 1 mil may not be attainable with the narrower band of frequencies.

Other features and advantages of the present invention will be apparent from the following more detailed description of the preferred embodiment, taken in conjunction with the accompanying drawings which illustrate, by way of example, the principles of the invention.

DETAILED DESCRIPTION OF THE INVENTION

A nondestructive inspection (NDI) or test (NDT) method for use with coating systems and nonmetallic structures such as ceramic matrix composite (CMC) material structures and polymer or polymeric matrix composite material (PMC) structures is set forth. The test also may be used to evaluate nonmetallic coatings overlying metallic structures. This test method utilizes electromagnetic waves in the Terahertz frequency range, referred to hereinafter as Terahertz testing, and finds particular use with multilayer nonmetallic systems including ceramic structures having one or more nonmetallic coating layers. The ceramic structure itself may comprise multiple layers of ceramic material, multiple layers of CMC material or mixed structures comprising ceramic layers and CMC layers. The test method also finds use with ceramic layers that comprise a matrix having substantially uniformly distributed particles or features within the matrix, such as coating systems that include fine porosity added to improve their thermal performance. The Terahertz testing also finds use in inspecting nonmetallic material systems such as CMC systems that include coatings which frequently are used in conjunction with CMC materials. However, any ceramic coating that includes a uniform distribution of fine particles either added as suspended particles or formed in the ceramic material, the size of which is smaller than the resolution capabilities of the present invention, may be tested using the test methods set forth herein.

Figure 1:
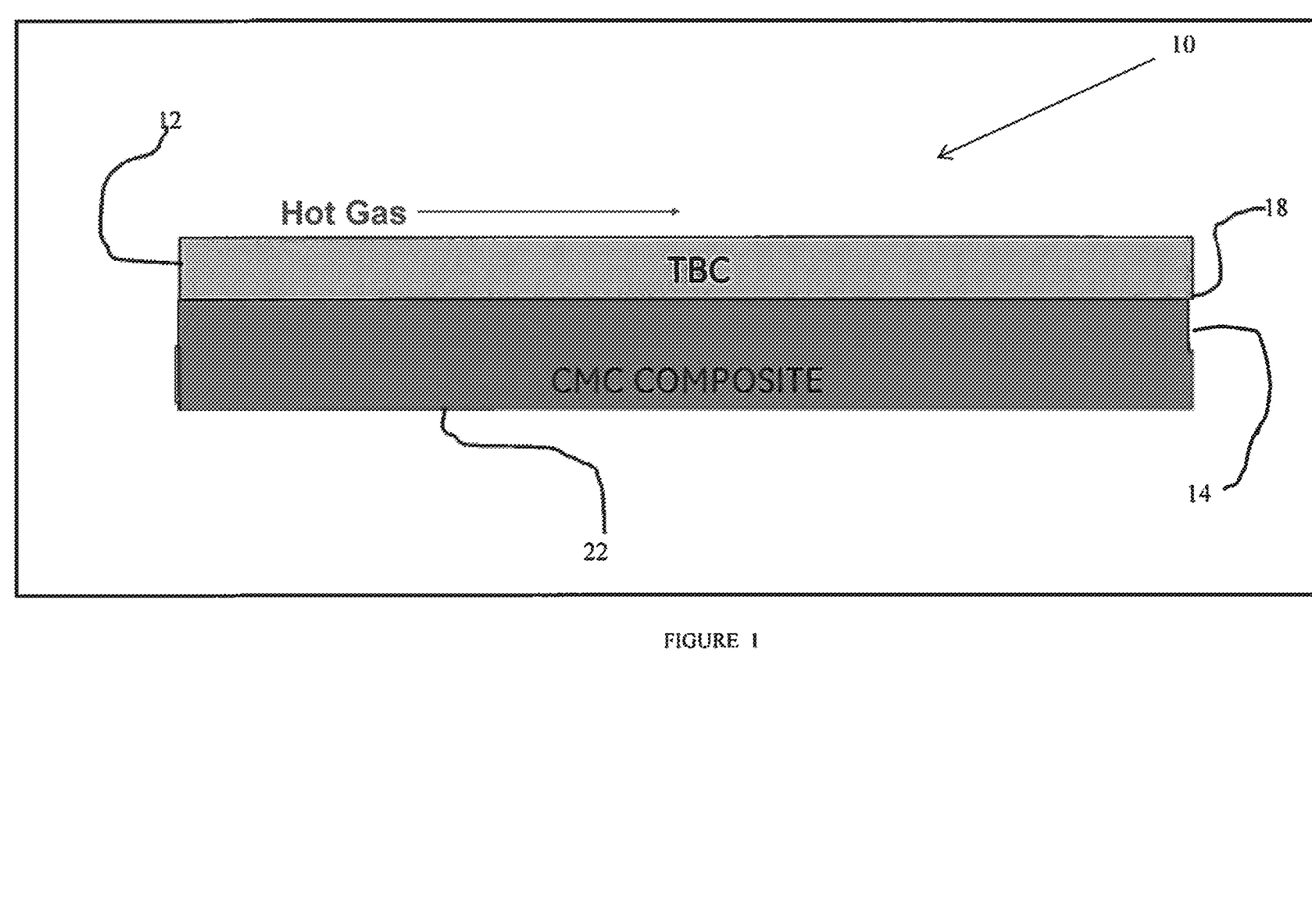
FIG. 1 is an exemplary cross section of an aircraft gas turbine engine exhaust comprising a CMC with a thermal barrier coating applied to it.

FIG. 1 represents a cross section of a structure in an aircraft gas turbine engine that includes a thermal barrier coating (TBC). Although the coating set forth if FIG. 1 is a TBC applied to the engine structure, any other non-metallic coating plurality of coatings applied to the structure, whether or not it includes particles of the size set forth above, such as wear coating or an environmental coating may be inspected. This structure 10 includes a (TBC) 12 in contact with hot exhaust gas from the turbine section (not shown) of the engine. TBC 12 forms a pathway and boundary for the hot exhaust gas from the turbine, and therefore has high temperature capabilities. It is also resistant to erosion from the hot gas flowing over it and is resistant to deterioration from oxidation or corrosion from the hot exhaust gases. TBC 12 forms at least a surface skin and preferably has a thickness sufficient to lower the temperature that the underlying structure is exposed to. In addition, the TBC also protects the underlying CMC from erosion resulting from contact with the hot, high velocity exhaust gases. Other surface skin arrangements include polymer and polymer matrix composite structures used in moderate temperature applications in which a higher temperature material acting as a TBC applied to the underlying structure improves the temperature performance of the structure.

In the example depicted in FIG. 1, CMC structure 14 is essentially NEXTEL™ AS-720, NEXTEL™ is a trademark of 3M of St. Paul, Minn. CMC structure NEXTEL™ AS-720 comprises woven fabric layers of alumina-boria-silica fibers infiltrated with a slurry of aluminosilicate that forms an aluminosilicate ceramic matrix when fired. Of course, the final selection of the CMC for any particular system is dependent upon system strength, geometric design and thicknesses required for the system. Alternatively, a CMC structure 14 utilizing an oxide-oxide CMC material may be used, although any CMC material or polymeric or PMC material that does not include semiconductive materials, such as for example silicon carbide (SIC) fibers, may be inspected with the Terahertz technique. Semiconductive fibers and particles of critical size and/or distribution such as SiC become reflective in the Terahertz range and are not penetrated by the Terahertz pulse. However, woven fabric layers of NEXTEL™ AS-720 illustrate the principles of the present invention.

As discussed above, the CMC structure 14 is coated with a TBC. The function of TBC coatings generally has been described above. While any TBC coating may be used, the selection of the coating overlying a nonmetallic structure such as CMC structure 14 is dependent upon a number of factors including but not limited to the temperature that the coating will be exposed to, the environment that the coating will be exposed to, the reparability of the coating, access of the coating for subsequent inspection and repair. For the purposes of this example, a common yttria stabilized zirconia (YSZ) is assumed as applied over a CMC composite, although the invention is not so limited. The system of FIG. 1 is representative of an aircraft structure in which access for TBC inspection is not available from the hot gas side, but access is available from the CMC composite side.

Still referring to FIG. 1, the test method of the present invention is not limited to nonmetallic materials systems, but may be used to inspect the nonmetallic portion of a system that includes a metallic substrate. Thus for example, TBC 12 may be a multilayer TBC coating applied over a metallic substrate, where the metallic substrate is substituted for the CMC composite 14. In this circumstance, there must be accessibility to the TBC for Terahertz inspection. The metallic substrate may be any metal, although in most applications, the metallic substrate comprises a metallic component having a metallic bond coat applied to it. The metallic bond coat most typically comprises a MCrAlY, where M is selected from the group consisting of Ni, Fe, Co and combinations thereof, to which the multilayer TBC is applied. A metallic substrate, which may be a high temperature superalloy such as an engine liner, or a titanium airframe component, is opaque to the Terahertz pulse used for Terahertz testing. Thus, a Terahertz pulse incident on such a structure is completely reflected back to the source from the metallic material through any overlying materials, here the multilayer TBC coating 14, when the source and the surface of the metallic structure are parallel to each other and each are perpendicular to the incident pulse.

Figure 2:
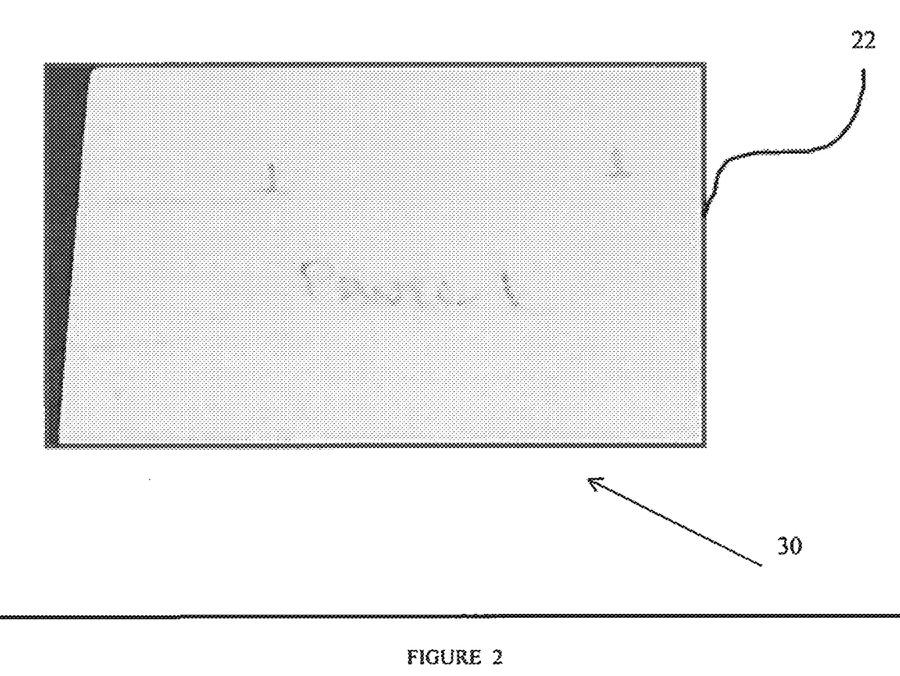
FIG. 2 depicts a test panel simulating the cross section of FIG. 1.
Figure 3:
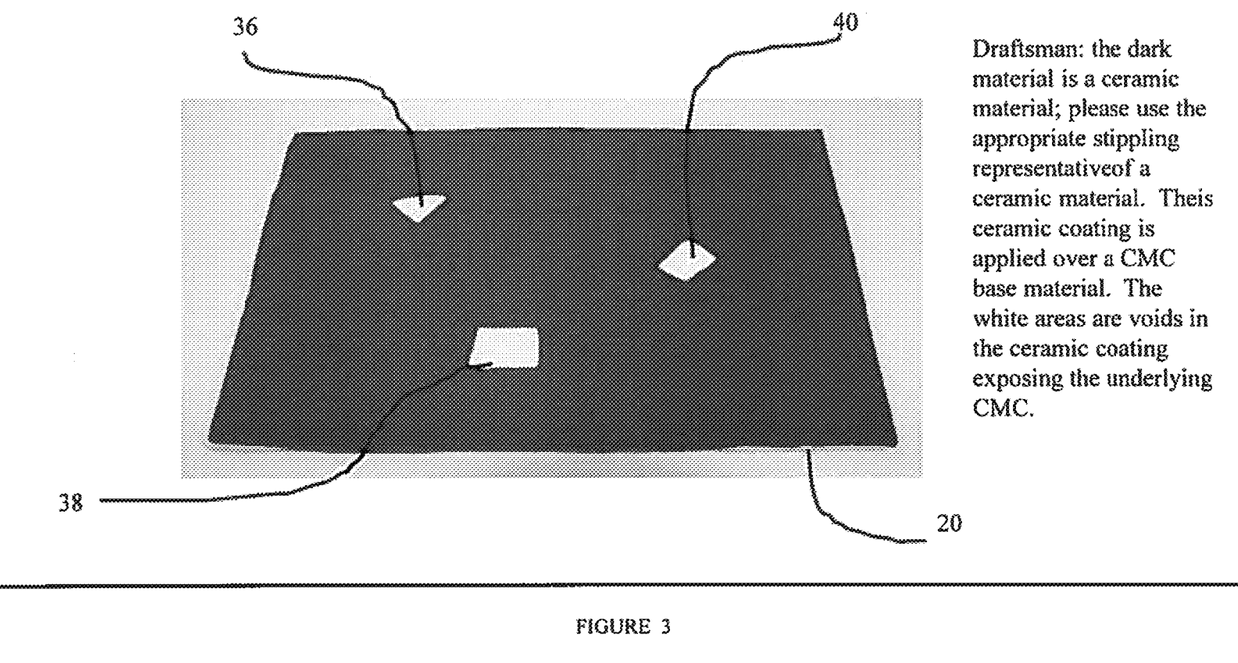
FIG. 3 depicts the test panel of FIGS. 1 and 2 with defects intentionally processed as missing TBC in the test panel at the interface of the TBC and the CMC.

FIG. 2 depicts a test panel 30 having a cross section similar to aircraft turbine structure shown in FIG. 1. Test panel 30 is meant to simulate such a cross section, and it is assumed that access for testing is only available to the front surface 22 of CMC composite, while TBC is assumed to be inaccessible. In this circumstance, any incident Terahertz pulse is only reflected back to the source when it encounters a change in impedance or index of refraction in the material under inspection indicative of an anomaly in the structure. If no anomalies are present in the structure, the Terahertz pulse passes through the structure otherwise unobstructed, since there is no metal present to reflect the pulse when the structure comprises TBC 12 applied over CMC composite 14. Test panel 30 includes defects 36, 38, 40 as shown in FIG. 3. The defects were intentionally formed at the TBC/CMC interface 18, see FIG. 1, which is the interface between the TBC and the CMC structure by providing areas devoid of TBC 12 on CMC structure 14, resulting in defects 36, 38 and 40 along interface 18. The CMC structure 14 is visible as bright areas through each of the defects in FIG. 3. The thickness of the TBC 12 comprising YSZ is about 51 mils (0.051 inches) and is substantially uniform across the cross section, except at the defect locations. Underlying TBC 12 and defects, 36, 38, 40 is a CMC structure 14 comprising NEXTEL™ AS-720, CMC structure 14 and TBC coating are bonded together. The CMC structure has a thickness of about 86 mils (0.086 inches). Test panel is constructed to assess the capabilities of the Terahertz testing to detect defects in a typical aircraft gas turbine engine structure having at least one nonmetallic component.

Test panel 30 was scanned using Terahertz testing by irradiating test panel 30 with a pulse in the Terahertz frequency range of 200 Gigahertz (GHz) (0.2 Terahertz) to 4 Terahertz (THz). The pulse generated for the inspection of panel 30 spanned the frequency range of 0.3-3 THz. This frequency range is unlike ultrasonic inspection in that the pulse generated is a high frequency electromagnetic pulse of energy and not an energy pulse in the sonic or near sonic frequency band. Although the frequency range used for Terahertz testing is intermediate that of ultrasonic inspection and radiographic inspection, it differs from either of these inspection processes in that the Terahertz testing generates multiple frequencies in a broadband arrangement (and hence wavelengths) during a test rather than a single principle frequency. Unlike either ultrasonic inspection or radiographic inspection, the generated Terahertz frequencies are completely reflected when encountering a metallic matrix. Furthermore, the Terahertz pulses readily penetrate ceramic materials and CMCs, whereas ultrasonic inspection and radiography are of limited use, if any use at all, in inspecting such materials. Finally, the Terahertz testing is able to penetrate and evaluate ceramic materials and CMC's even when these materials include fibers or a dispersion of distributed particles, whereas both ultrasonic inspection and radiographic inspection can be rendered completely ineffective by fibers or a dispersion of distributed particles, which can result in diffraction and scattering of the incident beam (ultrasonic) or masking of anomalies (radiography).

Figure 4:
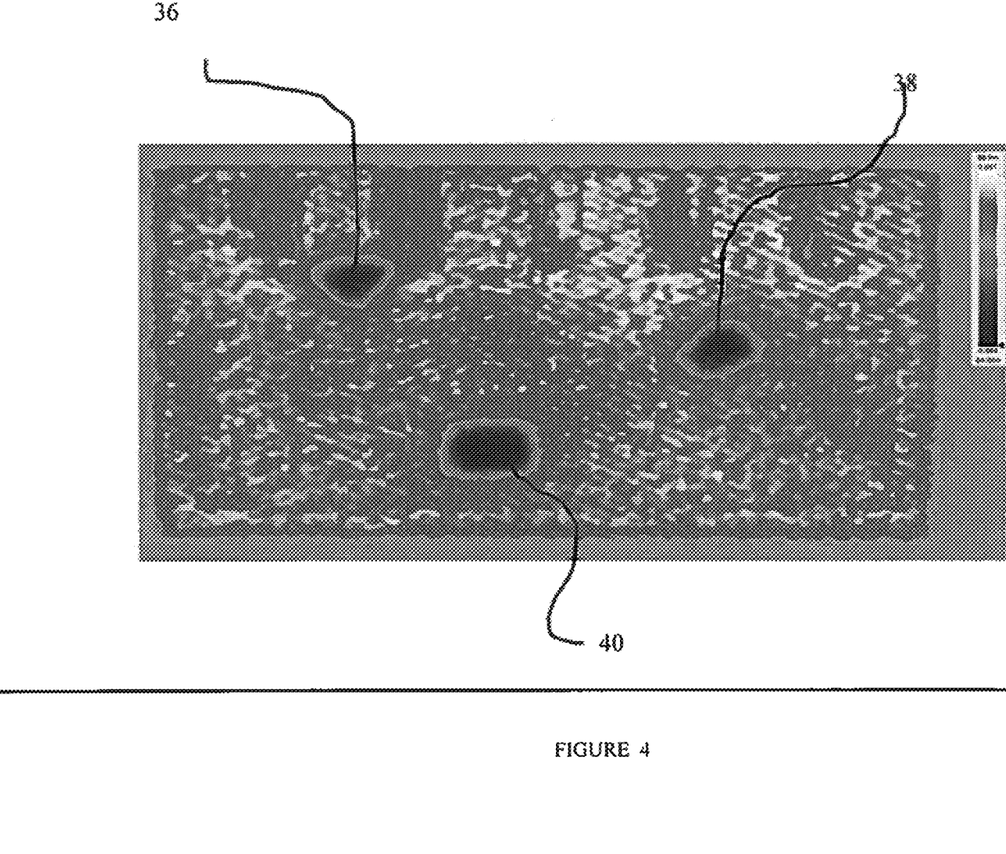
FIG. 4 is a C-scan (X-Y plane) of the test panel of FIGS. 2 and 3 using the Terahertz testing procedures of the present invention.
Figure 5:
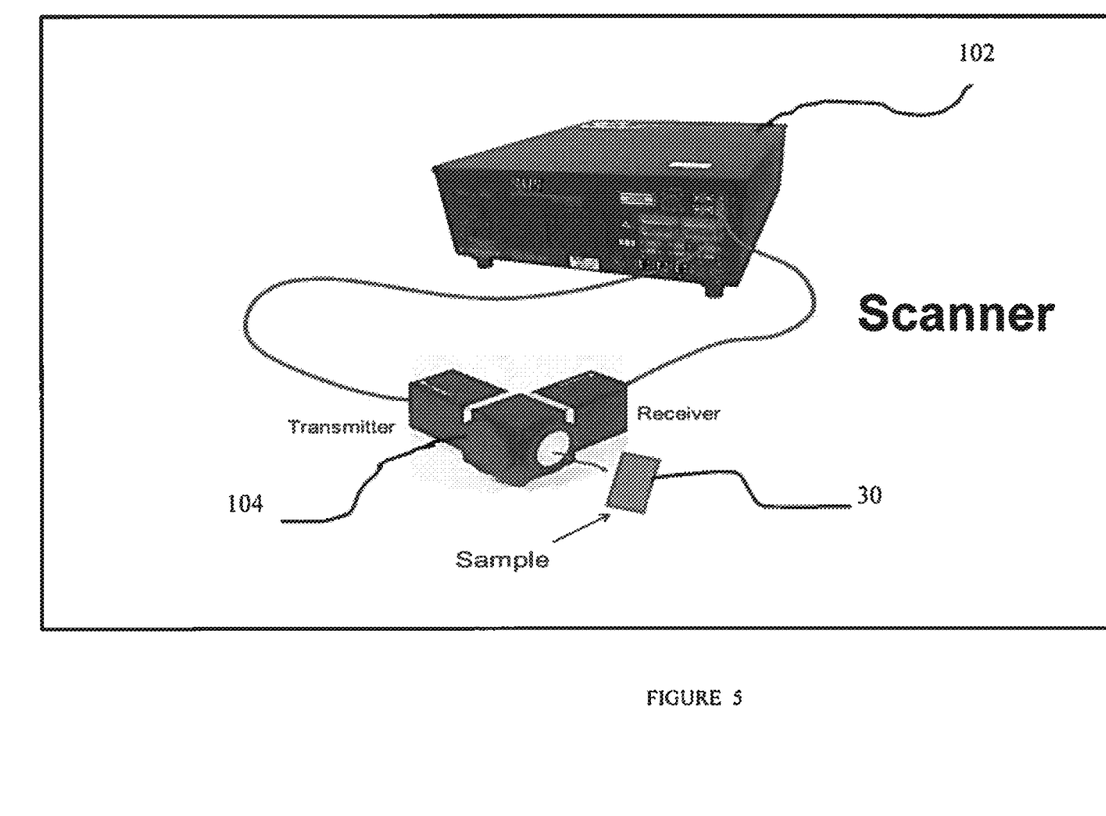
FIG. 5 depicts the Terahertz test equipment used to scan the test panel of FIG. 1 having the pre-placed defects shown in FIG. 3.

FIG. 4 is a C-scan or horizontal scan (X-Y plane) of test panel 30 of FIGS. 2 and 3. The scan recorded the results of the Terahertz testing. Test panel 30 has a total area of 24 square inches, the length in the "X" direction (FIG. 4) being 6 inches and the width in the "Y" direction being 4 inches. Testing was conducted using the Terahertz test equipment depicted in FIG. 5. A Terahertz scanner 102 that includes a pulse generator and a pulse reader/analyser was used. The particular model utilized was a T-RAY 5000 available from API of Ann Arbor, Mich. Scanner 102 was coupled to a transceiver 104 that delivered the generated pulse through a lens having a 3 inch focal length onto test panel 30 and received the reflected pulse from test panel 30 and returned it to scanner for resolution and storage. As depicted in FIG. 5, the pulse is generated and a reflected pulse is received using a transceiver positioned on one side of the material under inspection. It will be recognized by those skilled in the art that a two transducer system may be used in place of the transceiver depicted in FIG. 5. When utilizing two transducers, the transducers are placed on opposed sides of the material or component undergoing inspection. One transducer applies the signal generated by the signal generator and the other transducer on the opposite side receives the signal after passing through the material, returning the received signal to a signal analyzer for evaluation.

In the evaluation producing the results set forth in FIG. 4, the scanner or transducer was positioned adjacent to test panel 30 so that the pulse provided to test panel 30 was delivered perpendicular to outer surface of CMC structure 22, since for this test demonstration it is assumed that the TBC surface adjacent the hot gas flow path in an exhaust system is not available for inspection. Pulse transmissions are timed to allow an initial pulse to be generated, traverse the thickness of the panel 30 after being reflected from ground plane 16 and received by transceiver 104. The minimum time t between pulses is determined by $$t = 2T/c \qquad (eq.\ 1)$$

where c=the speed of light in the medium, and T represents the thickness of the material being inspected, here the TBC and the CMC material. As can be determined, the minimum time required between pulses is a very short time indeed, even when the overall thickness of the coating and CMC is increased significantly beyond the 137 mils (0.137 inches) of panel 30. The actual time gate utilized for scanning of panel 30 was 30-50 picoseconds after the impulse response at the front face reflection. The overall time required to scan test panel 30 using these parameters is about 12.5 minutes.

Because reflections occur at interfaces, such as between a TBC and the CMC, the thickness $T_L$ of each layer may be accurately determined by measuring the time from the initial pulse generation until the time that a reflection is received from a layer or layers using a slight modification of equation 1 set forth as eq. 1a below:

$$t_L = 2T_L/c \qquad (eq.\ 1a)$$

where $t_L$ is a measured time for the reflected pulse of the layer of interest. The equation then may be solved for the thickness of any layer in a multilayer system, such as by an algorithm in the signal analyzer, at any location. Such a determination may require determination and subtraction of the thickness of any intervening layers.

The pulse is sequentially applied to panel 30 during the scan perpendicular to surface 22. The scan comprised the application of the pulse for a first predetermined period of time to a first location, termed a pixel, followed by a second period of time in which no pulse is generated, the minimum time determined by eq. 1 above. Each pixel size is 0.5×0.5 mm. The pulse generator was indexed to a second position and the pulse was applied in the same manner at the second position. The scan rate was 40 mm/s. This process was repeated until structure 10 was completely scanned.

Figure 6:
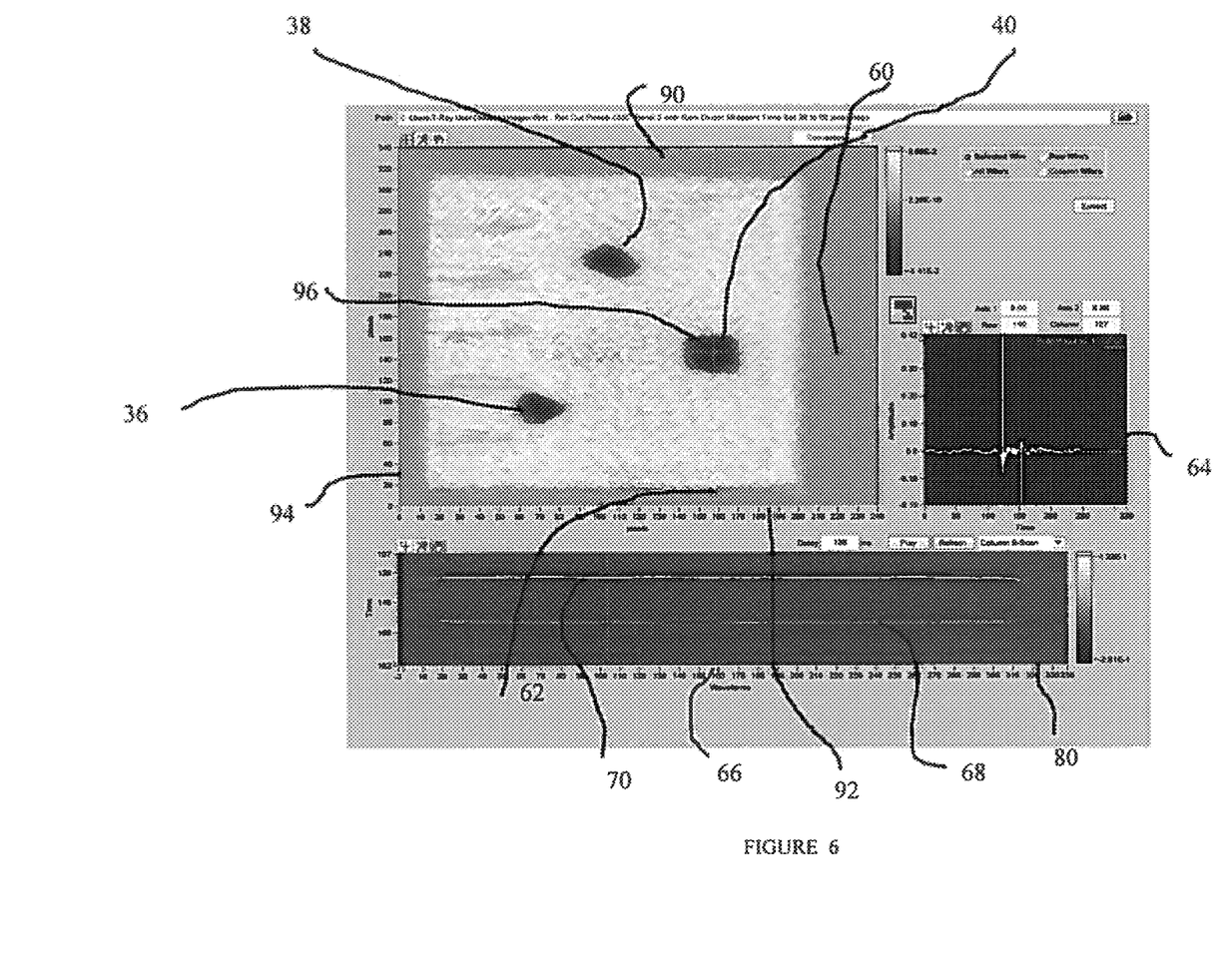
FIG. 6 represents a vertical scan providing data through a defect along one axis, indicative of the mapping available for additional data collection using Terahertz testing.

The reflected pulse at each tested location was returned to the transceiver and each pixel is stored as a discrete unit of information. This stored information is thus permanently available for further analysis, as required. FIG. 4 depicts an X-Y analysis of the scanned coupon created from the stored information representing the reflected pulses. As is evident from the C-scan representative of the X-Y plane of the test piece, the Terahertz test process was able to reproduce defects 36, 38, 40 intentionally introduced into panel 30. The change in impedance between the CMC structure 14 and air at each of defects 36, 38 and 40 is different than the change in impedance between either CMC structure 14 and TBC 12 or between TBC 12 and air, and this difference is displayed in FIG. 4 at each of the locations at which the defects were intentionally introduced. Because the reflected pulses are stored as discrete units of information and the distance to the defect from the outer surface of the CMC structure can be determined by the amount of time each pulse was traversing the panel, further information can be gathered about the defects. FIG. 6 is an example of the additional information that can be obtained from the stored information representative of each pulse. FIG. 6 includes a vertical representation through panel 30 as a B-scan 80 that provides representation of defect 40 in the "Z" direction, that is, within the depth of panel 30. All of the defects 36, 38, 40 are shown in the C-scan in the X-Y plane 90 of FIG. 6. The C-scan of the X-Y plane 90 includes a scaled "X" axis 92 and a scaled "Y" axis 94. Defect 40 includes a point 96 having a value of 157 as determined from the "X" scale and 146 as determined from the "Y" scale. Point 96 may be represented in the C-scan of the "X-Y" plane as (157, 146). Axis 62 extends through point 96 and is parallel to "Y" axis 94 and perpendicular to "X" axis 92. Axis 62 thus extends through defect 40 parallel to "Y" axis 94 and through point 96 at "Y" position 146. The time delay for pixel location (X,Y) corresponding to (157, 146) is about 151 Pico-seconds determined from A-scan 64, which provides a time scale for the pulse traversing the coupon as represented by the peaks and troughs. This information establishes a single point in wavepoint pattern 66 of B-scan 80. By plotting each of the pixels across axis 62, the shape of defect 40 along this axis can be established, as shown in wavepoint pattern 66 and the depth of defect 40 in the structure can be determined. The cross section of defect 40 along axis 62 is depicted in B-scan 80 in the "Z" direction, that is, within the depth of coupon 30. As can be seen, the defect extends along axis 62 from "Y" position 125 to "Y" position 162 and has a constant depth. As should be evident to those skilled in the art, the entire vertical cross-section that includes all of the defects completely reproduced by scanning all of the "Y" axes extending through the coupon parallel to "Y" axis 94 and corresponding A-scans resulting in a three-dimensional representation of the volume of coupon 30 could be created. Referring again to wavepoint pattern 66, which represents coupon 30 in a vertical direction along axis 62, defect 40 is located beneath CMC structure 14, shown by bright line 68 representing the reflection of the pulse from first interface 18 between CMC and TBC, except in the region of defect 40 where there is no TBC, resulting in a change in the reflection at this location. Line 70 at time of about 118 Pico-seconds represents a reflection of the pulse at the front surface 22 of CMC 14. The time delay of 151 Pico-seconds obtained from A-scan 64 represents the reflection from the TBC/CMC interface (and CMC/air interface where TBC is missing). The defect is visible in the image as the missing segment of line or, by contrast a dark line, since the reflection from the CMC/air interface is different than the reflection from the CMC/TBC interface because these two interfaces have different indices of refraction, producing different contrasts along line 68. That defect is at about the same depth as the CMC/TBC coating interface, represented by line 68, strongly suggests from wavepoint pattern 66 that the defect 40 is a void beneath the CMC structure 14, which in fact it is, as the defect was intentionally placed at this location and demonstrates the ability of Terahertz testing to detect a void in the TBC coating and the depth of the void.

A further evaluation of FIG. 4 indicates that Terahertz testing is effective in determining differences in dielectric constant within the ceramic materials comprising CMC structure and TBC coating. As is evident from FIG. 6, there is some reflection of the Terahertz pulse as it passes from one medium to an adjacent medium. Here the reflections will occur as the pulse passes from air into the CMC structure, from the CMC structure to the TBC (or air where defects 36, 38, 40) and from the TBC into air, in accordance with Snell's law. But the ability to resolve differences in impedances in ceramic structures provides Terahertz testing with the capability to inspect ceramic structures for imperfections, at least as those imperfections can be determined by differences in impedances between the imperfection(s) and the surrounding matrix. In FIG. 3, minor differences in impedances can be seen in the CMC material which is indicated in red. These minor differences represent some non-uniformity in what is supposed to be a uniform weave or structure of the fiber throughout the CMC structure. Terahertz testing may be used to inspect structures having a matrix that includes a dispersion of particles. These particles may be of a material having a significant density than the matrix and may be formed within matrix during processing or may be intentionally added to the matrix. As long as the particles are smaller than the minimum resolvable size that Terahertz testing can resolve, the particles should not interfere with the testing, particularly when the particles are uniformly or substantially uniformly distributed within the matrix. Thus particles that are measured in microns and distributed within a ceramic matrix substantially uniformly should provide an impedance that is constant and the individual particles should not be resolved by the Terahertz testing. Clearly, if the particles within the ceramic material approached the resolution of the pulse, the particles would reflect the incident Terahertz pulse and would be resolved as a change in impedance. Defects 36, 38 and 40 are observable because they represent a difference in dielectric constant as would be expected if there was a lack of bonding between the TBC and underlying material or an accumulation of voids.

Because of the ability of the Terahertz testing to determine differences in dielectric constant or impedance across a ceramic material, Terahertz testing should be able to resolve the following types of defects, when present: voids, delaminations, density differences, and may be able to detect non-homogenous regions and anisotropic regions within a structure. One of the limitations of Terahertz testing is that the energy levels of the electromagnetic pulses used for this testing are insufficient to penetrate metallic surfaces which may underlie a TBC. However, this limitation may be useful to determine anomalies such as when a second phase is added to a TBC or a CMC structure and is not uniformly distributed as intended. Even though the individual particles may be below the resolution capability of the Terahertz testing technique, when sufficient particles have agglomerated, a change in impedance at the location of the agglomeration may be detectable. Terahertz testing should be capable of detecting this type of inhomogeneity and determine the depth within TBC or a CMC structure at which it is located.

Terahertz testing thus may be used effectively to determine the adequacy of a CMC structure and a ceramic coating either individually or when used together. Further, Terahertz testing can be used to evaluate multiple layers of ceramic, ceramic-based and nonmetallic materials simultaneously, as demonstrated in FIG. 3 in which both the CMC layer and the TBC layer were simultaneously scanned. The only limitation is that a reflective layer, such as a metallic layer or semiconductive fabric or particles above a critical size, cannot be penetrated by Terahertz testing, and nonmetallic layers underlying such reflective features therefore cannot be evaluated. The Terahertz testing can determine the presence of anomalies in either a CMC structure or a TBC coating by determining the difference in dielectric constant across the material. The anomalies can be evaluated to determine whether they are sufficient to compromise the structure to which they are attached. The anomalies in a CMC structure can be evaluated in terms of the engineering performance of the structure. The Terahertz testing can determine anomalies such as delaminations or lack of bond between the plies forming the CMC as well as voids and density differences within a ply or across the plies. Furthermore Terahertz testing can be used to determine the precise layers or depth within the component that the anomalies are located. In TBCs, Terahertz testing can be used to determine the presence of lack of bond or delamination between the TBC and the adjoining material forming the substrate. When multiple layers of TBC are applied, Terahertz testing can be used to determine delamination or lack of bond between layers or with the substrate. It can also be used to test for defects such as voids, density differences, non-homogenous regions and non-isotropic regions in CMC structures or applied ceramic coatings.

The Terahertz test procedure has been described in conjunction with an aircraft turbine structure having a CMC structure with an adjacent TBC or a metallic substrate and an overlying TBC, such as an engine exhaust duct in an engine application. In these applications, the Terahertz test procedure is effective in detecting anomalies in the TBC coating, and the metallic substrate will effectively act as the ground plane described previously, the metallic substrate reflecting the pulse back to the receiver. The reflected pulse can be effectively filtered out electronically so that it does not interfere with interpretation of the detected anomalies. The Terahertz test procedure is also effective in detecting defects in CMC structures including delaminations between layers in multilayer CMC structures as well as defects that may be present within individual layers of CMC structures. The Terahertz test procedure is also useful to determine the thickness of a ceramic or CMC structure or the thickness of individual layers in multilayer systems.

Because the Terahertz test procedure utilizes a wide band of frequencies in the Terahertz frequency range of 0.2-4 THz and not a single frequency or narrow band of frequencies, the Terahertz test procedure is capable of resolving anomalies and their depth within a structure to a size of about 1 mil (0.001 inches), and the resolution is not restricted by the single frequency or narrow band of frequencies. Because anomalies of 0.001 inches can be resolved, it is preferred that any particles added to or formed in a ceramic material, such as for example, uniformly: distributed porosity or balls have a size no greater than about 0.0005 inches (½ mil) to avoid false indications and an invalid test. However, this should not represent a problem as the long as sizes or major dimensions of these particles are smaller than ½ mil and remain as micron-sized. The Terahertz test procedure is effective in testing structures having a substantially uniform cross section or a cross section that changes gradually, such as are found in ceramic plies used to fabricate CMC structures and TBCs. However, currently, the Terahertz test procedure is not effective where the cross sections are not uniform or where there are rapid changes in contour. This may be understood because non-uniform cross sections and rapid changes in contour are also regions in which the impedances of the material changes rapidly even though the material includes no anomalies in these regions. In addition, these non-uniform geometric features may result in low angle refractions and diffraction, preventing the incident waves from returning to the receiver.

The invention finds particular use for inspecting coatings after their application to the substrate of an aircraft structure as well as for determining the integrity of a CMC structure. This permits an evaluation of the adequacy of the applied coating or the CMC structure to perform the task for which it was designed. The inspection allows for a determination of the presence of defects such as lack of bond, delamination, excessive voids, large, high density particles, nonhomogeneous particle distribution when particle distribution is a feature of the ceramic (whether coating or CMC structure) or other defects that may be detrimental to performance of the coating, while specifically identifying those areas that should be repaired. The invention is also useful for nondestructively testing TBC coatings on active aircraft after returning from service. The Terahertz test, being nondestructive, can determine the adequacy, of such TBC, coatings after, high temperature service. Delaminations such as may occur in multilayer materials, subsurface damage, lack of bonding and other anomalies that may have developed from service or other cause and not visible from the exterior can be detected and analyzed to determine acceptability for return to service or whether repairs should be performed prior to return to service.

While the invention has been described with reference to a preferred embodiment, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. A method for nondestructively inspecting a nonmetallic structure, comprising the steps of:
   providing a nonmetallic structure having an interior between two surfaces;
   scanning the interior of the structure with an electromagnetic pulse in the range of 200 GHz to 4 THz;
   evaluating the electromagnetic pulse after it passes through the non-metallic structure;
   determining impedance differences in the non-metallic structure based on the evaluation of the electromagnetic pulse; and
   based on the impedance differences identifying the presence of a defect in the interior of the structure.

2. The method of claim 1 wherein the step of providing a nonmetallic structure, further includes providing the nonmetallic structure a portion of which has two phases further comprising particles uniformly distributed within a ceramic-based matrix.

3. The method of claim 1 wherein the step of providing a nonmetallic structure wherein the nonmetallic structure is a ceramic matrix composite material.

4. The method of claim 3 wherein the ceramic matrix composite material further comprises multiple layers of ceramic material bonded at interfaces between layers.

5. The method of claim 4 wherein the ceramic matrix composite material including the multiple layers of ceramic material and the interfaces between layers are scanned, evaluated and impedance differences are determined and assessed.

6. The method of claim 2 wherein the step of providing a nonmetallic structure a portion of which has two phases further includes providing particles uniformly distributed within the matrix having no dimension greater than 0.0005 inches (0.5 mils).

7. The method of claim 1 wherein the nonmetallic structure comprises a non-conductive coating overlying a metallic substrate.

8. The method of claim 1 wherein the nonmetallic structure further comprises a non-conductive coating overlying a ceramic matrix composite structure wherein the non-conductive coating is selected from the group consisting of a thermal barrier coating, an environmental coating, a wear coating and combinations thereof.

9. The method of claim 3 wherein the ceramic matrix composite material comprises woven fabric layers of alumina-boria-silica fibers in a ceramic matrix.

10. The method of claim 7 wherein the metallic substrate is an aircraft component.

11. The method of claim 1 wherein the step of scanning is accomplished in the range of 0.3-3 THz.

12. The method of claim 1 further including a step of recording the electromagnetic pulse after the pulse passes through the non-metallic structure.

13. The method of claim 12 wherein the step of recording includes printing an image of the pulse representing impedance differences in the nonmetallic structure.

14. The method of claim 12 wherein the step of recording includes storing a signal representative of the electromagnetic pulse after it passes through the nonmetallic structure.

15. The method of claim 14 further including a step of recalling the stored signals representative of the electromagnetic pulse, further evaluating the electromagnetic pulse and further determining impedance differences in the non-metallic structure.

16. The method of claim 1 further including the step of assessing the impedance differences to establish acceptance/rejection criteria for the nonmetallic structure undergoing Terahertz testing and comparing the determined impedance differences to the established acceptance/rejection criteria.

* * * * *